United States Patent
Hammer-Altmann et al.

(10) Patent No.: US 7,678,290 B2
(45) Date of Patent: Mar. 16, 2010

(54) METHOD FOR PRODUCTION OF PZT-BASED CERAMICS HAVING A SLOW SINTERING TEMPERATURE

(75) Inventors: Marianne Hammer-Altmann, Weinheim (DE); Marc Kuehlein, Gerlingen (DE); Karolin Lofruthe, Duesseldorf (DE)

(73) Assignee: Robert Bosch GmbH, Stuttgart (DE)

( * ) Notice: Subject to any disclaimer, the term of this patent is extended or adjusted under 35 U.S.C. 154(b) by 204 days.

(21) Appl. No.: 10/539,913

(22) PCT Filed: Apr. 14, 2004

(86) PCT No.: PCT/DE2004/000775

§ 371 (c)(1),
(2), (4) Date: Jun. 16, 2005

(87) PCT Pub. No.: WO2004/110953

PCT Pub. Date: Dec. 23, 2004

(65) Prior Publication Data

US 2006/0043844 A1   Mar. 2, 2006

(30) Foreign Application Priority Data

Jun. 10, 2003   (DE) ............................... 103 26 041

(51) Int. Cl.
  *C04B 35/491* (2006.01)
  *H01L 41/187* (2006.01)

(52) U.S. Cl. ............................... 252/62.9 PZ; 501/134
(58) Field of Classification Search .......... 252/62.9 PZ; 501/134; 310/311, 364, 363
See application file for complete search history.

(56) References Cited

U.S. PATENT DOCUMENTS 3,666,666  A  *  5/1972  Haertling .............. 252/62.9 PZ
5,993,895  A  *  11/1999  Jang et al. .................... 427/79
6,773,621  B2  *  8/2004  Hammer et al. ....... 252/62.9 PZ

FOREIGN PATENT DOCUMENTS

WO   WO 02 055450   4/2002

OTHER PUBLICATIONS

Cheng et al, "The properties of low-temperature fired piezoelectric ceramics", Jour. Materl. Sci., vol. 21, No. 2, Feb. 1986, pp. 571-576.*

* cited by examiner

*Primary Examiner*—C. Melissa Koslow
(74) *Attorney, Agent, or Firm*—Kenyon & Kenyon LLP

(57) ABSTRACT

A method for manufacturing a PZT-based low-sintering piezoelectric ceramic material, the ions to be added as starting compounds being added as powdered oxides and/or powdered carbonates, mixed together, and then calcined to form the piezoelectric ceramic material. After calcining the starting compounds, lithium in ionic form is added to the mixture in an amount of 0.01 to 0.1 wt. % in relation to the weight of the PZT ceramic.

2 Claims, No Drawings

METHOD FOR PRODUCTION OF PZT-BASED CERAMICS HAVING A SLOW SINTERING TEMPERATURE

FIELD OF THE INVENTION

The present invention relates to a method for manufacturing PZT-based ceramics having a low sintering temperature.

DESCRIPTION OF RELATED ART

Ceramic, in particular piezoceramic, components, include several, in particular many, layers (multilayer components); they are usable, for example, as actuators in piezostacks due to the fact that a low-inertia mechanical deflection of a relatively high force is achieved by voltage triggering, or are usable as bending elements due to the fact that voltage triggering causes a high mechanical deflection of low force, or they allow high electric voltages to be generated, or are used in appropriate devices for detecting mechanical vibrations or for generating acoustic vibrations.

Previous technical approaches are predominantly based on ceramic compounds of a Perovskite-type structure of the general formula $ABO_3$, the piezoelectric properties being manifested in the ferroelectric state. Lead-zirconate titanate ceramics $Pb(Zr_{1-x}Ti_x)O_3(PZT)$, modified by certain additives, i.e., PZT-based ceramics, have proven to be particularly advantageous. Noble metal internal electrodes applied using serigraphic methods are located between ceramic layers manufactured using typical ceramic foil technology. When appropriate additives or dopants are used, PZT-based piezoelectric ceramics have an excellent combination of properties, such as high temperature resistance, a high piezoelectric charge constant, high Curie temperature, low dielectric constant, and low coercive field intensity.

PZT-based piezoelectric ceramics are sintered together with copper- or Ag/Pd-based electrode compound layers in a cofiring process to form an electromechanical multilayer component. If Ag/Pd mixtures having a silver content considerably higher than 70 wt. % or even pure silver internal electrodes, which are less expensive than platinum-based materials or internal electrodes having a higher platinum content, are used for forming such multilayer components, a lower sintering temperature is desirable, because silver internal electrodes have a relatively low melting point of approximately 960° C.

Low-sintering PZT compositions, such as Zr-, Nb-, and Ti (PZ-PN-PT)-based ternary systems, are known. These compositions often have a high PbO excess as a sintering aid, which has the disadvantage that it strongly interacts with internal electrodes of Ag, AgPd, or copper, for example, in the application as piezoelectric multilayer actuators. A high PbO excess has, in general, a disadvantageous effect, because it has the tendency to form low-melting metal (Ag, Pd, Cu)-Pb alloys. In extreme cases, the internal electrodes run out or adhere by melting. In principle, interaction between the PZT ceramic and the internal electrode material has also been observed in ternary systems or binary systems having complex doping (regarding content and number of dopants). A high PbO excess in combination with ternary systems or binary systems having complex doping is therefore considered particularly critical.

Furthermore, sintering aids such as additives of barium in the form of $Ba(Cu_{0.5}W_{0.5})O_3$, vanadium in the form of $V_2O_5$, or glasses containing boron, bismuth and cadmium (BBC) are known for lowering the sintering temperature. Lithium additives in the form of $Li_2CO_3$ or $LiNO_3$ are also known, but they have been unable to achieve the desired effect of lowering the sintering temperature while preserving or even improving the electromechanical properties. Instead, the opposite occurred, i.e., the properties deteriorated in comparison with PZT ceramics without the addition of sintering aids. One reason for this is that both the amount of sintering aids and the type of addition must be precisely adjusted to the specific PZT composition.

SUMMARY OF THE INVENTION

It is an object of the invention to allow for the manufacture of a low-sintering PZT-based piezoceramic having comparable or improved electromagnetic properties compared to conventional ceramics of this type. A sintering temperature in the range of 850° C. to 950° C. may be obtained.

These and other objects of the invention are achieved by a method for manufacturing a low-sintering PZT-based piezoelectric ceramic material, the ions to added being added in the form of powdered oxides and/or powdered carbonates as starting compounds, mixed together and then calcined to form the piezoelectric ceramic material, wherein after calcining the starting compounds, lithium in salt form is added to the mixture in an amount in the range of 0.01 to 0.1 wt. % in relation to the weight of the PZT ceramic.

Multilayer components having pure Ag internal electrodes may be constructed using the ceramics manufactured according to the invention. Furthermore, multilayer components having standard internal electrodes based on AgPd alloys, Cu, or the like may be sintered and manufactured in a time-saving and cost-effective manner.

DETAILED DESCRIPTION OF THE INVENTION

It is advantageous, if compositions simply doped using rare earth metals, in particular La or Nd, are used as PZT basic materials.

Additional advantages result from the use of compositions doped using combinations of elements selected from the group made up of Ca, La, Nb, Fe, and Cu.

It has been found that controlled addition of lithium in salt form in the range of 0.01 to 0.1 wt. % in the case of special PZT compositions, for example those proposed in WO 02/055450 A1, is capable of lowering the sintering temperature of the PZT ceramic by at least 100° C. (from 1000° C. to 900° C., for example), the electromechanical properties being preserved or even improved in relation to comparable PZT ceramics without such additives. The amount of additive depends on the PbO excess percentage and on the selection of the dopant proportions and thus on the lead lattice vacancies.

PZT-based piezoceramics having a sintering temperature of approximately 900° C. and electromechanical properties such as high elongations and low dielectric constants, for example, which are comparable or even improved in relation to the related art, are preferably obtained for manufacturing multilayer actuators for fuel injection systems.

This opens the possibility, for example, of manufacturing actuators having high elongation and other advantageous electromechanical properties, which have pure Ag internal electrodes having a relatively low melting point of approximately 960° C. Actuators having pure Ag internal electrodes have the advantage that they may be sintered in air and thus a higher process complexity may be avoided.

Furthermore, actuators having standard internal electrodes based on AgPd alloys, Cu, or the like may be sintered and manufactured at lower temperatures and thus in a time-saving and cost-effective manner.

PZT ceramics are usually manufactured from the starting components $ZrO_2$, PbO, $TiO_2$, using controlled addition of dopants for precisely setting the material properties by the known mixed oxide or precursor method. In the mixed oxide method, all ions to be added to the piezoelectric ceramic element to be manufactured are added as powdered oxides and/or powdered carbonates, mixed together, and then calcined to form the piezoelectric ceramic material. The amounts of oxides or carbonates to be added result from the composition of the piezoelectric ceramic material to be obtained. In contrast, in the precursor or columbite method, powdered zirconium dioxide and powdered titanium dioxide are initially calcined to form $Zr_y Ti_{1-y} O_2$ where $0.5<y<0.55$ (in mols); this powder, used as a precursor, is then mixed with powdered oxides and/or powdered carbonates of the other ions; and this powdered mixture is then calcined to form the piezoelectric ceramic material in the form of a homogeneous PZT mixed crystal.

Addition of low amounts of lithium in ionic form may lower the sintering temperature of the ceramic material obtained by at least approximately 100° C. from 1000° C. to 900° C., for example, while preserving or improving the electromechanical properties.

It has been found that, in the case of simply doped PZT compositions, i.e., in contrast to compositions doped with a plurality of dopants using rare earth metals such as La or Nd, the sintering temperature is lowered by at least approximately 100° C. Although in these compositions the electromechanical properties are not improved, in particular the elongation or the related piezoelectric constant $d_{33}$ is not increased; however, these properties are not deteriorated.

It has been furthermore found that, in the case of PZT compositions doped using combinations of the elements Ca, La, Nb, Fe, Cu, the sintering temperature is not only lowered by at least approximately 100° C., but the electromechanical properties are also improved significantly. The elongation values, which are measured, for example, when a 2 kV/mm electrical field is applied, increase by an order of magnitude of up to 25%, as can be seen from the following table.

| PZT Material | Sintering Temperature | Coercive Field [kV/mm] | Elongation in ‰ (after polarization) @ 2 kV/mm |
| --- | --- | --- | --- |
| Nd-doped PZT | 1000° C. | 1.20 | 1.07 |
| Nd-doped PZT + 0.05 wt. % Li additive | 900° C. | 1.00 | 1.01 |
| PZT with RB-doping | 950° C. | 1.35 | 1.14 |
| PZT with RB-doping + 0.02 wt. % Li additive | 900° C. | 1.11 | 1.39 |
| PZT with RB-doping + 0.05 wt. % + Li additive | 900° C. | 0.97 | 1.40 |

RB doping: Doping as in WO 02/055450.

In addition to the amount of lithium to be added, which is preferably in a range of 0.01 to 0.1 wt. % in relation to the weight of the PZT ceramic, the mode of addition is also decisive. Thus, for example, the sintering temperature cannot be lowered if addition takes place as early as during homogenization of the starting materials.

It has been shown to be particularly advantageous to add the lithium compound after calcining the starting components to achieve the effect according to the present invention. If addition takes place before calcining, the properties may be improved under certain circumstances, but the sintering temperature is not lowered. It has been observed that, when addition takes place before calcining, the electromagnetic properties are improved, but the sintering temperature cannot be lowered. This may be explained by the fact that the relatively volatile lithium compounds evaporate uncontrollably during calcining and thus are no longer available in sufficient quantities to form a low-melting liquid phase.

Namely, the added lithium compound, together with the existing PbO excess, forms such a low-melting liquid phase during the sintering process. As a result, the phase of early compacting of the ceramic and thus the entire sintering process is displaced toward lower temperatures.

In addition, due to the low amount of added lithium compound, a negative interaction of the sintering aid with the PZT ceramic and the electrode material is minimized, while the positive effect as a sintering aid is achieved. Furthermore, the small amounts of $Li^+$ seem to become incorporated in the PZT crystal structure and influence the lead lattice vacancies of the system in such a way as to favor grain growth and thus to improve elongation.

It is not yet clear what additional effect an assumedly present grain boundary phase may have. Based on the fact that lithium compounds easily evaporate at these temperatures (approximately 900° C.), the proportion of an otherwise critical secondary phase should be relatively small.

Three possibilities are conceivable:
a) Lithium is incorporated into the PZT structure (A or B site)—this has a hardening effect, because it acts as an acceptor.
b) Lithium settles at the grain boundaries—this results in deterioration of the properties.
c) Lithium evaporates—this is advantageous, as long as there is still sufficient lithium to positively influence the sintering process.

Addition of excessive amounts of lithium, i.e., more than approx. 0.1 wt. %, results in deterioration of the electromagnetic properties. If 1 wt. % lithium is added in the form of $Li_2CO_3$, the measured $d_{33}$ values are a relatively low 286 pC/N (picoCoulomb/Newton) for a relatively high sintering temperature of 950° C., or 352 pC/N for a higher sintering temperature of 1050° C.

The addition of lithium in the form of salts, such as $Li_2CO_3$ or $LiNO_3$, has been found to be particularly advantageous. Other elements from the group of alkaline earth metals such as Na or K, also added as carbonates or nitrates, are also conceivable as sintering aids.

What is claimed is:

1. A method for manufacturing a low-sintering PZT-based piezoelectric ceramic material having the general formula $Pb(Zr_{1-x}Ti_x)O_3$, comprising: mixing together ions added in the form of powdered oxides or powdered carbonates of at least lead, zirconium and titanium as starting compounds, and calcining the starting compounds to form the piezoelectric ceramic material, wherein after calcining the starting compounds, lithium in salt form is added to the mixture in an amount in the range of 0.01 to 0.1 wt. % in relation to the weight of the PZT ceramic, wherein a sintering temperature in the range of 850° C. to 950° C. is obtained for the mixture of calcined starting compounds and ionic lithium;
wherein the starting compound mixture is doped using combinations of elements selected from the group consisting of Ca, La, Nb, Fe, and Cu.

2. A method for manufacturing a low-sintering PZT-based piezoelectric ceramic material having the general formula $Pb(Zr_{1-x}Ti_x)O_3$, comprising: mixing together ions added in the form of powdered oxides or powdered carbonates of at least lead, zirconium and titanium as starting compounds, and calcining the starting compounds to form the piezoelectric ceramic material, wherein after calcining the starting compounds, lithium in salt form is added to the mixture in an amount in the range of 0.01 to 0.1 wt. % in relation to the weight of the PZT ceramic, wherein a sintering temperature in the range of 850° C. to 950° C. is obtained for the mixture of calcined starting compounds and ionic lithium;

wherein lithium is added in the form of $Li_2CO_3$ or $LiNO_3$; and wherein the starting compound mixture is doped using combinations of elements selected from the group consisting of Ca, La, Nb, Fe, and Cu.

* * * * *